United States Patent
Heo et al.

(10) Patent No.: US 10,862,060 B2
(45) Date of Patent: Dec. 8, 2020

(54) ORGANIC LIGHT EMITTING DEVICE AND METHOD OF FABRICATING THE SAME

(71) Applicant: LG Display Co., Ltd., Seoul (KR)

(72) Inventors: Jeong-Haeng Heo, Gyeonggi-do (KR); Jae-Man Lee, Seoul (KR); Jeong-Kyun Shin, Gyeonggi-do (KR); Gwi-Jeong Cho, Daegu (KR); So-Yeon Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 538 days.

(21) Appl. No.: 13/899,755

(22) Filed: May 22, 2013

(65) Prior Publication Data
US 2013/0313535 A1    Nov. 28, 2013

(30) Foreign Application Priority Data
May 22, 2012    (KR) .................. 10-2012-0054490

(51) Int. Cl.
*H01L 51/50*    (2006.01)
*H01L 51/56*    (2006.01)
*H01L 27/32*    (2006.01)

(52) U.S. Cl.
CPC ...... *H01L 51/5064* (2013.01); *H01L 51/5008* (2013.01); *H01L 51/56* (2013.01); *H01L 27/3209* (2013.01); *H01L 2251/558* (2013.01)

(58) Field of Classification Search
CPC ............. H01L 51/5064; H01L 51/5278; H01L 51/504; H01L 51/5044; H01L 51/5096;
(Continued)

(56) References Cited

U.S. PATENT DOCUMENTS 8,847,215 B2 * 9/2014 Park .................... H01L 51/5064
                                                                                                                  257/40
8,980,662 B2 * 3/2015 Lee ..................... C23C 14/042
                                                                                                                  438/34
(Continued)

FOREIGN PATENT DOCUMENTS

CN        1617642 A     5/2005
CN        1711001 A     12/2005
(Continued)

OTHER PUBLICATIONS

A. Assadi et al., Field- effect mobility of poly(3- hexylthiophene), 1988, Applied Physics Letters, vol. 53, pp. 195-197.*
(Continued)

*Primary Examiner* — Dylan C Kershner
(74) *Attorney, Agent, or Firm* — Morgan, Lewis & Bockius LLP

(57) ABSTRACT

An organic light emitting device includes a substrate, a first electrode on the substrate, a second electrode, a first stack on the first electrode and including a hole injection layer, a first hole transport layer, a first mixed layer, a second hole transport layer, a first light emitting layer, and a first electron transport layer sequentially laminated, a second stack between the first stack and the second electrode and including a third hole transport layer, a fourth hole transport layer, a second light emitting layer, and a second electron transport layer sequentially laminated, and a charge generation layer between the first stack and the second stack to control charge balance between the first and second stacks. The first mixed layer includes materials used to form the first and second hole transport layers.

9 Claims, 12 Drawing Sheets

(58) Field of Classification Search
CPC . H01L 51/5056; H01L 51/50; H01L 51/5008; H01L 51/56; H01L 2251/558; H01L 51/0062; H01L 51/0065
USPC ......... 428/690, 917, 691; 313/500–512, 504, 313/506; 257/40, 88–104, 257/E51.001–E51.052; 427/58, 66; 252/301.16–301.35
See application file for complete search history.

(56) References Cited

U.S. PATENT DOCUMENTS

| | | | |
|---|---|---|---|
| 9,065,052 B2 * | 6/2015 | Kim | H01L 51/0001 |
| 2002/0113545 A1 * | 8/2002 | Adachi | H01L 51/5016 313/504 |
| 2002/0121860 A1 * | 9/2002 | Seo | H01L 51/5012 313/506 |
| 2002/0149010 A1 * | 10/2002 | Wakimoto | H01L 51/0053 257/40 |
| 2002/0195929 A1 * | 12/2002 | Haase | H01L 51/001 313/504 |
| 2003/0170491 A1 * | 9/2003 | Liao | H01L 51/5036 428/690 |
| 2003/0230980 A1 * | 12/2003 | Forrest | H01L 51/5016 313/600 |
| 2005/0106419 A1 * | 5/2005 | Endoh | H01L 51/5048 428/690 |
| 2005/0280355 A1 | 12/2005 | Lee et al. | |
| 2006/0097623 A1 | 5/2006 | Abe et al. | |
| 2006/0105201 A1 * | 5/2006 | Lee | H01L 27/3211 428/690 |
| 2006/0261731 A1 | 11/2006 | Aziz et al. | |
| 2007/0252516 A1 * | 11/2007 | Kondakova | H01L 51/5016 313/504 |
| 2009/0212688 A1 * | 8/2009 | Song | H01L 51/508 313/504 |
| 2010/0187984 A1 * | 7/2010 | Lin | C07D 491/04 313/504 |
| 2010/0283039 A1 * | 11/2010 | Meng | B82Y 10/00 257/40 |
| 2011/0006294 A1 * | 1/2011 | Tanaka | C08G 61/02 257/40 |
| 2012/0091448 A1 | 4/2012 | Ueno et al. | |
| 2012/0097998 A1 * | 4/2012 | Pieh | H01L 51/5278 257/89 |
| 2012/0098011 A1 | 4/2012 | Choi et al. | |
| 2012/0098012 A1 | 4/2012 | Kim et al. | |

FOREIGN PATENT DOCUMENTS

| | | | |
|---|---|---|---|
| CN | 1790729 | A | 6/2006 |
| CN | 1856196 | A | 11/2006 |
| CN | 102456840 | A | 5/2012 |
| EP | 1531501 | A2 | 5/2005 |
| JP | 04357694 | A * | 12/1992 |
| JP | 2011-023711 | A | 2/2011 |
| KR | 10-2006-0120506 | A | 11/2006 |
| KR | 10-2010-0076789 | A | 7/2010 |

OTHER PUBLICATIONS

Nakano et al., machine translation of JP-04357694-A, 1992, pp. 1-5. (Year: 1992).*

Nakano et al., Human translation of JP H04-357694A, 1992, pp. 1-18. (Year: 1992).*

Wu et al., "Hole-transport properties of a furan-containing oligoaryl", Journal of Applied Physics (2003) vol. 93, pp. 5465-5471. (Year: 2003).*

Zhang et al., "Non-amine-based furan-containing oligoaryls as efficient hole transporting materials" Chemical Communications (2002) pp. 2336-2337. (Year: 2002).*

Naka et al., "Carrier transport properties of organic materials for EL device operation" Synthetic Metals (2000) vol. 111-112, pp. 331-333. (Year: 2000).*

SciFinder entry for CAS Registry No. 123847-85-8 (see the attached "Chemical Names for CAS Registry No. 123847-85-8" document). (Year: 2018).*

First Notification of Office Action dated May 28, 2015 from The State Intellectual Property Office of China in counterpart Chinese application No. 201310187330.1.

Office Action dated May 11, 2018, from the Korean Patent Office in counterpart Korean application No. 10-2012-0054490.

* cited by examiner

ORGANIC LIGHT EMITTING DEVICE AND METHOD OF FABRICATING THE SAME

This application claims the benefit of priority of Korean Patent Application No. 10-2012-0054490, filed on May 2012, which is hereby incorporated by reference as if fully set forth herein.

BACKGROUND

Field of the Disclosure

The present disclosure relates to an organic light emitting device and, more particularly, to an organic light emitting device with improved efficiency and lifespan.

Discussion of the Related Art

For an image display device that displays a variety of information on a screen as a core technology in advanced information and communication, there is continuous progress in development of slim, lightweight, and portable devices with improved performance. Hereupon, organic light emitting devices that display an image by adjusting an amount of light emitted from an organic light emitting layer are recently receiving attention as flat panel display devices having reduced weight and volume, which are drawbacks of cathode ray tubes (CRTs).

An organic light emitting device (OLED), which is a self-emitting device using a thin light emitting layer disposed between electrodes, may have a paper thin design. The organic light emitting device generally includes an anode, a hole injection layer (HIL), a hole transport layer (HTL), a emitting layer (EML), an electron transport layer (ETL), an electron injection layer (EIL), and a cathode.

In this regard, the hole transport layer includes a plurality of layers, for example, first and second hole transport layers, in order to improve hole mobility. However, when the hole transport layer has a double layer structure, movement of holes to the light emitting layer is interrupted by an interfacial barrier between the first and second hole transport layers. Accordingly, driving voltage may increase and lifespan and efficiency of the device may decrease.

SUMMARY

Accordingly, the present invention is directed to an organic light emitting device and a method of fabricating the same that substantially obviate one or more problems due to limitations and disadvantages of the related art.

An object of the present invention is to provide an organic light emitting device capable of improving efficiency and lifespan by removing an interfacial barrier between hole transport layers and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device may include a substrate, a first electrode on the substrate, organic layers on the first electrode, the organic layers including a hole injection layer, a first hole transport layer, a mixed layer, a second hole transport layer, a light emitting layer, and an electron transport layer sequentially laminated on the first electrode, and a second electrode on the organic layers. The mixed layer may be formed of materials used to form the first and second hole transport layers.

In another aspect of the present invention, an organic light emitting device may include a substrate, a first electrode on the substrate, a second electrode, a first stack on the first electrode and including a hole injection layer, a first hole transport layer, a first mixed layer, a second hole transport layer, a first light emitting layer, and a first electron transport layer sequentially laminated, a second stack between the first stack and the second electrode and including a third hole transport layer, a fourth hole transport layer, a second light emitting layer, and a second electron transport layer sequentially laminated, and a charge generation layer between the first stack and the second stack to control charge balance between the first and second stacks. The first mixed layer includes materials used to form the first and second hole transport layers.

In another aspect of the present invention, a method of fabricating an organic light emitting device may include forming a first electrode on a substrate, forming a first stack by sequentially laminating a hole injection layer, a first hole transport layer, a first mixed layer, a second hole transport layer, a first light emitting layer, and a first electron transport layer on the first electrode, forming a charge generation layer by sequentially laminating an n-type charge generation layer and a p-type charge generation layer on the first electron transport layer of the first stack, and forming a second stack by sequentially laminating a third hole transport layer, a fourth hole transport layer, a second light emitting layer, and a second electron transport layer on the p-type charge generation layer. The first mixed layer is formed by co-depositing materials used to form the first and second hole transport layers to mix the materials of the first and second hole transport layers.

It is to be understood that both the foregoing general description and the following detailed description of embodiments in accordance with the present invention are exemplary and explanatory and are intended to provide further explanation of the invention as claimed.

BRIEF DESCRIPTION OF THE DRAWINGS

The accompanying drawings, which are included to provide a further understanding of the present embodiments and are incorporated in and constitute a part of this application, illustrate embodiment(s) in accordance with the invention and together with the description serve to explain principles of the embodiments in accordance with the invention. In the drawings.

DETAILED DESCRIPTION OF THE EXEMPLARY EMBODIMENTS

Reference will now be made in detail to exemplary embodiments, examples of which are illustrated in the accompanying drawings. The same reference numbers may be used throughout the drawings to refer to the same or like parts. In the following description, detailed descriptions of known functions and configurations incorporated herein will be omitted when it may obscure the subject matter of the present embodiments.

Hereinafter, exemplary embodiments will be described in detail with reference to FIGS. 1 to 7D.

Figure 1:
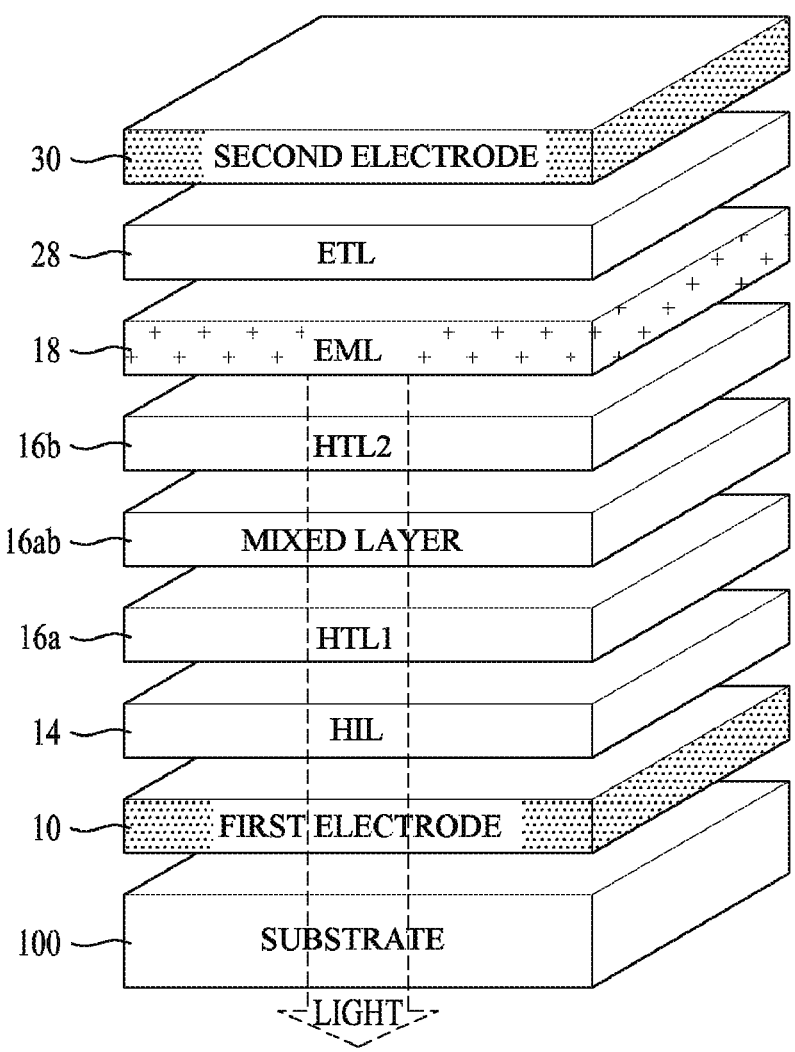
FIG. 1 is a perspective view illustrating an organic light emitting device according to a first embodiment.
Figure 2:
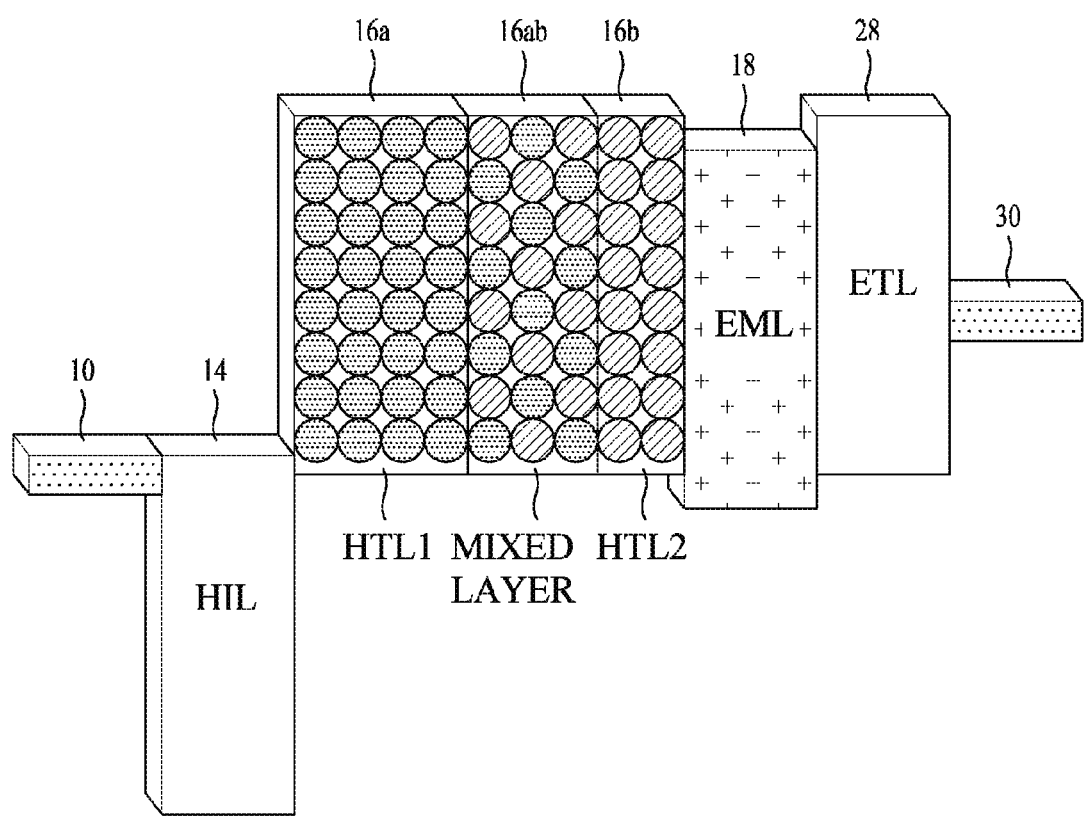
FIG. 2 is an energy band diagram of the organic light emitting device of FIG. 1.

FIG. 1 is a perspective view illustrating an organic light emitting device according to a first embodiment. FIG. 2 is an energy band diagram of the organic light emitting device of FIG. 1

With reference to FIGS. 1 and 2, an organic light emitting device according to the first embodiment includes a first electrode 10, organic layers including a light emitting layer 18, and a second electrode 30. When the organic light emitting device applies a voltage to a first electrode 10 and a second electrode 30, holes injected from the first electrode 10 and electrons injected from the second electrode are recombined to create excitons that emit light when falling from an excited state to a ground state.

The first electrode 10 as an anode may be formed of a transparent conductive material, for example, a transparent conductive oxide (TCO) such as indium tin oxide (ITO) and indium zinc oxide (IZO).

The second electrode 30 as a cathode may be formed of a reflective metallic material such as aluminum (Al), gold (Au), molybdenum (MO), chromium (Cr), copper (Cu), and LiF or an alloy of aluminum and LiF.

The organic layers of FIGS. 1 and 2 include a hole injection layer 14, a first hole transport layer 16a, a mixed layer 16ab, a second hole transport layer 16b, a light emitting layer 18, and an electron transport layer 28, which are sequentially laminated.

The electron transport layer 28 transports electrons received from the second electrode 30 to the light emitting layer 18. The first hole transport layer 16a transports holes received from the hole injection layer 14 to the second hole transport layer 16b, has the greatest thickness of the organic layers, and adjusts the cavity of the organic light emitting device. The second hole transport layer 16b transports holes received from the first hole transport layer 16a to the light emitting layer 18 and has a Triplet Energy (T1) higher than that of the light emitting layer 18 to prevent holes transported to the light emitting layer 18 from reentering the second hole transport layer 16b. That is, the second hole transport layer 16b functions as a hole blocking layer, thereby improving efficiency of the organic light emitting device. The first hole transport layer 16a is formed of an amine derivative represented by Formula 1 below. Here, R1≠R2≠R3, and R1, R2, and R3 constitute an aromatic ring compound. In addition, the second hole transport layer 16b is formed of a furan or thiophene derivative and has a hole mobility of $10^{-7}$ to $10^{-5}$ cm$^2$/Vs. In addition, the first hole transport layer 16a has a thickness of 400 Å to 1400 Å, and the second hole transport layer 16b has a thickness of 100 Å to 150 Å.

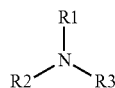

Formula 1

The mixed layer 16ab is formed between the first and second hole transport layers 16a and 16b using materials used to form the first and second hole transport layers 16a and 16b. Particularly, the mixed layer 16ab removes an interfacial barrier between the first hole transport layer 16a and the second hole transport layer 16b to facilitate hole injection, thereby improving efficiency and lifespan of the organic light emitting device, since the mixed layer 16ab is formed of the same materials respectively used to form the first and second hole transport layers 16a and 16b formed of different materials, and is formed between the first and second hole transport layers 16a and 16b. The mixed layer 16ab is formed by co-depositing the materials used to form the first hole transport layer 16a and the second hole transport layer 16b to a thickness of 10 Å to 1000 Å. Table 1 shows driving voltage (V), efficiency (cd/A), and lifespan (hour) of the organic light emitting device with respect to the thickness of the mixed layer.

TABLE 1

| | Thickness of mixed layer (Å) | Voltage (V) | Current efficiency (Cd/A) | Lifespan (T90) |
|---|---|---|---|---|
| OLED with HTL1/HTL1 + HTL2/HTL2 structure | 50 | 4.6 | 7.1 | 51 |
| | 250 | 4.6 | 7.5 | 70 |
| | 450 | 4.6 | 7.4 | 75 |
| | 650 | 5.0 | 7.5 | 25 |
| | 850 | 4.9 | 7.4 | 35 |
| | 900 | 5.0 | 7.4 | 32 |
| | 950 | 5.0 | 7.3 | 32 |
| | 1000 | 5.0 | 6.9 | 30 |

Based on the results shown in Table 1, the organic light emitting device exhibited a lowest driving voltage of 4.6 V and a high current efficiency of 7.4 to 7.5 when the thickness of the mixed layer is within the range of 250 Å to 450 Å. In addition, the T90 value of the lifespan refers to time for the device to reach a 90% state of the lifespan. For example, when the thickness of the mixed layer is 250 Å, the time for the device to reach the 90% state of the lifespan is 70 hours. The organic light emitting device may have improved driving voltage (V) characteristics, efficiency (cd/A), and lifespan by forming a mixed layer between hole transport layers formed of different materials as illustrated in Table 1.

Figure 3:
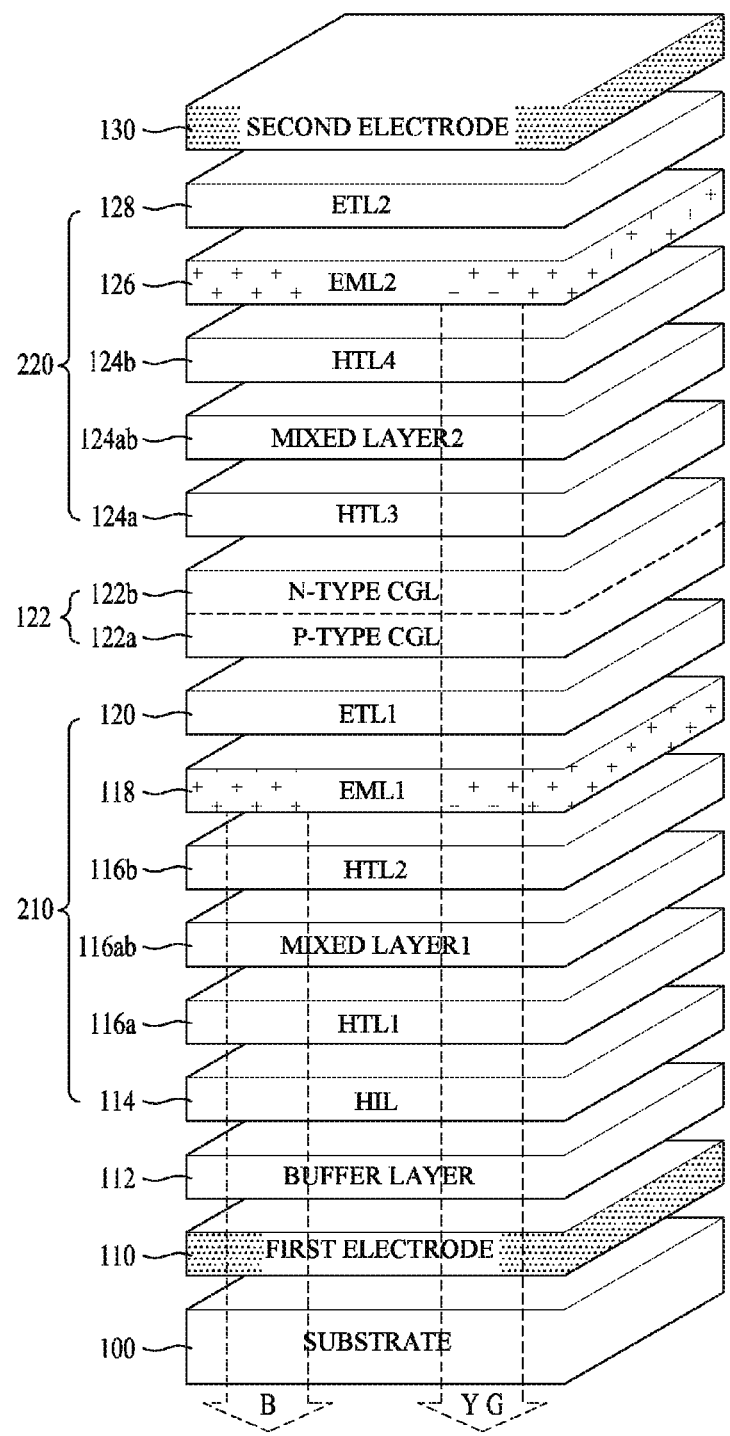
FIG. 3 is a perspective view illustrating an organic light emitting device according to a second embodiment.
Figure 4:
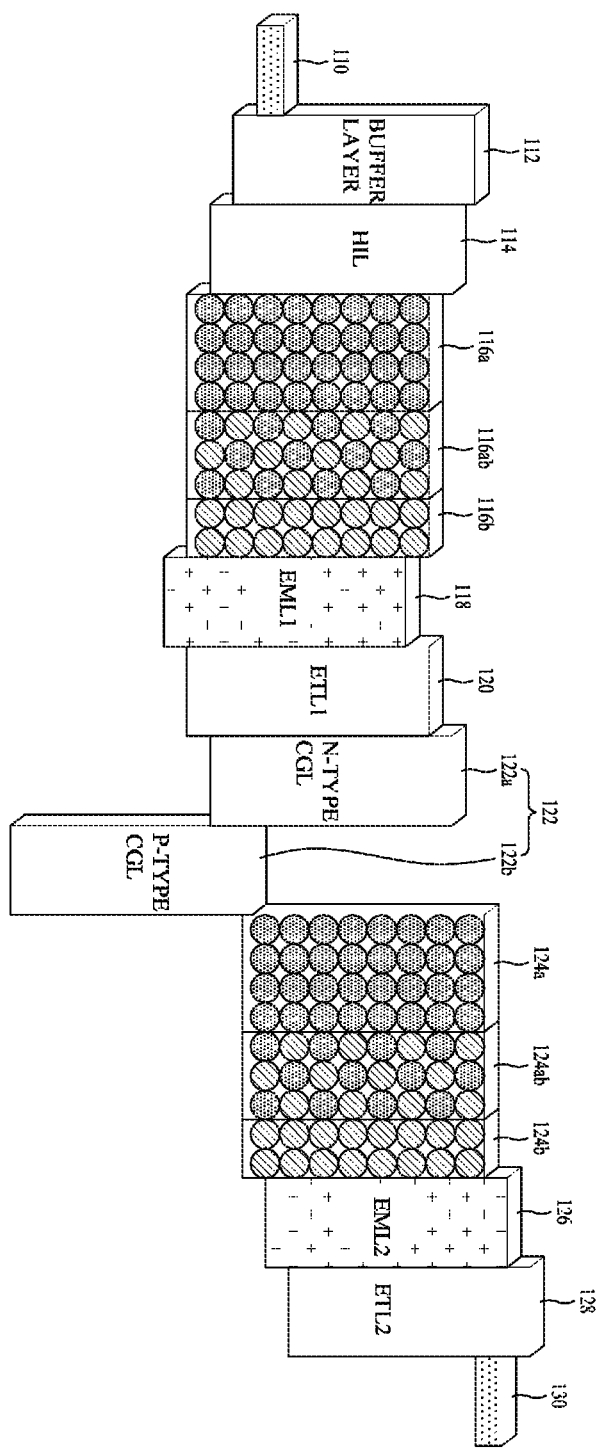
FIG. 4 is an energy band diagram of the organic light emitting device of FIG. 3.

FIG. 3 is a perspective view illustrating an organic light emitting device according to a second embodiment. FIG. 4 is an energy band diagram of the organic light emitting device of FIG. 3.

With reference to FIGS. 3 and 4, an organic light emitting device according to the second embodiment includes a first electrode 110 and a second electrode 130, which are formed on a substrate opposite to each other, and a first stack 210, a charge generation layer 122, and a second stack 220, which are laminated between the first electrode 110 and the second electrode 150. Such an organic light emitting device having a multi-stack structure includes stacks respectively including light emitting layers that emit light with different colors. White light is embodied when light beams having different colors emitted from the light emitting layers of the stacks are mixed. The organic light emitting device according to the second embodiment realizes white light by mixing blue light emitted from the first light emitting layer 118 and yellow-green light emitted from the second light emitting layer 126.

The first electrode 110 as an anode may be formed of a transparent conductive material, for example, a transparent conductive oxide (TCO), such as indium tin oxide (ITO) and indium zinc oxide (IZO).

The second electrode 130 as a cathode may be formed of a reflective metallic material, such as aluminum (Al), gold (Au), molybdenum (MO), chromium (Cr), copper (Cu), LiF, or an alloy of aluminum and LiF.

The first stack includes a buffer layer 112, an hole injection layer 114, a first hole transport layer 116a, a first mixed layer 116ab, a second hole transport layer 116b, a first light emitting layer 118, and a first electron transport layer 120, which are sequentially laminated between the first electrode 110 and the charge generation layer 122. In this regard, the first light emitting layer 118 is a light emitting layer including a host doped with blue fluorescence dopant, thereby emitting blue light.

The first electron transport layer 116a transports electrons received from an n-type charge generation layer 122a to the first light emitting layer 118. The first hole transport layer 116a transports holes received from the hole injection layer 114 to the second hole transport layer 116b, has the greatest thickness of the first stack, and adjusts the cavity of the organic light emitting device. In addition, the second hole transport layer 116b transports holes received from the first hole transport layer 116a to the first light emitting layer 118 and has a Triplet Energy (T1) higher than that of the first light emitting layer 118 to prevent holes transported to the first light emitting layer 118 from reentering the second hole transport layer 116b. That is, the second hole transport layer 116b functions as a hole blocking layer, thereby improving efficiency of the organic light emitting device. The first hole transport layer 116a is formed of an amine derivative represented by Formula 1 below. Here, R1≠R2≠R3, and R1, R2, and R3 constitute an aromatic ring compound. In addition, the second hole transport layer 116b is formed of a furan or thiophene derivative and has a hole mobility of $10^{-7}$ to $10^{-5}$ cm$^2$/Vs. In addition, the first hole transport layer 116a has a thickness of 400 Å to 1400 Å, and the second hole transport layer 116b has a thickness of 100 Å to 150 Å.

Formula 1

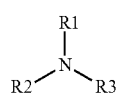

The first mixed layer 116ab is formed between the first and second hole transport layers 116a and 116b using materials used to form the first and second hole transport layers 116a and 116b. Particularly, the first mixed layer 116ab removes an interfacial barrier between the first hole transport layer 16a and the second hole transport layer 16b to facilitate hole injection, thereby improving efficiency and lifespan of the organic light emitting device, since the first mixed layer 116ab is formed of the same materials respectively used to form the first and second hole transport layers 116a and 116b formed of different materials. The first mixed layer 116ab is formed by co-depositing the materials used to form the first hole transport layer 116a and the second hole transport layer 116b to a thickness of 10 Å to 1000 Å.

As described above, the interfacial barrier between the first and second hole transport layers 116a and 116b may be removed by the first mixed layer 116ab. A plurality of holes from the first electrode 110 are not annihilated in layers other than the light emitting layer but are used in light emission in the first light emitting layer 118 for transition to an excited state to improve light emission efficiency.

Particularly, holes injected from the first electrode 110 and electrons injected from the n-type charge generation layer are recombined in the first light emitting layer 118, creating excitons, and blue light is emitted when the excitons fall from an excited state to a ground state. As described above, the second hole transport layer 116b transports holes received from the first hole transport layer 116a to the first light emitting layer 118. The second hole transport layer 116b has a slower hole mobility than conventional hole transport layers. That is, a hole transport layer adjacent to the light emitting layer generally includes NPD, and the hole mobility of NPD is $10^{-7}$ cm$^2$/Vs, which is higher than that of the second hole transport layer 116b. As described above, when the hole mobility of the hole transport layer adjacent to the light emitting layer is high, a large number of holes are not recombined with electrons in the first light emitting layer 118. Instead, the holes move to the first electron transport layer 120 to be annihilated. However, since the second hole transport layer 116b adjacent to the first light emitting layer 118 has a low hole mobility, the holes injected into the first electrode 110 may be recombined with electrons in the first light emitting layer 118 for transition to an excited state instead of moving to the first electron transport layer 120. Although the hole mobility of the first hole transport layer 116a is higher than that of the second hole transport layer 116b, the same effect may be obtained by removing the interfacial barrier between the first and second hole transport layers 116a and 116b using the first mixed layer 116ab.

The charge generation layer (CGL) 122 may control charge balance between stacks. The charge generation layer 122 includes an n-type organic layer 122a disposed adjacent to the first stack 210 and injecting electrons into the first stack 210 and a p-type organic layer 122b disposed adjacent to the second stack 220 and injecting holes into the second stack 220.

The second stack 220 includes a third hole transport layer 124a, a second mixed layer 124ab, a fourth hole transport layer 124b, a second light emitting layer 126, and a second electron transport layer 128, which are sequentially laminated between the second electrode 130 and the charge generation layer 122. The second light emitting layer 126 may be a single light emitting layer including a host doped with yellow-green phosphorescence dopant or a single light emitting layer including two hosts doped with yellow-green phosphorescence dopant.

The second electron transport layer 128 transports electrons received from the second electrode 130 to the second light emitting layer 126, and the third hole transport layer 124a transports holes received from the p-type charge generation layer 122b to the fourth hole transport layer 124b. The fourth hole transport layer 124b transports the holes received from the third hole transport layer 124a to the second light emitting layer 126. The third hole transport layer 124a is formed of the same material as the first hole transport layer 116a of the first stack 210 and the fourth hole transport layer 124b is formed of the same material as the second hole transport layer 116b of the first stack 210. Thus, a detailed description thereof will not be given. The second mixed layer 124ab is formed between the third and fourth hole transport layers 124a and 124b using materials respectively used to form the third and fourth hole transport layers 124a and 124b. The second mixed layer 124ab removes an interfacial barrier between the third and fourth hole transport layers 124a and 124b to facilitate hole injection, thereby improving efficiency and lifespan of the organic light emitting device, since the second mixed layer 124ab is formed of the same materials respectively used to form the third and fourth hole transport layers 124a and 124b formed of different materials, and is formed between the third and fourth hole transport layers 124a and 124b. Thus, the second mixed layer 124ab is formed by co-depositing the materials used to form the third hole transport layer 124a and the fourth hole transport layer 124b to a thickness of 10 Å to 1000 Å. Since the second mixed layer 124ab has the same effects as the first mixed layer 116ab due to having the same constituent elements and materials, a detailed description thereof will not be given.

Although the organic light emitting device according to the second embodiment includes the first and second stacks 210 and 220, the organic light emitting device may also have a multi-stack structure including at least two stacks. In addition, in the organic light emitting device having a multi-stack structure including at least two stacks, each stack may include at least two hole transport layers formed of different materials, and a mixed layer may be formed between the hole transport layers formed of different materials. Meanwhile, as illustrated in FIGS. 3 and 4, the first stack 210 includes the first mixed layer 116ab, and the second stack 220 includes the second mixed layer 124ab. However, a mixed layer may also be formed only on one of the first stack 210 and the second stack 220, but the present embodiments are not limited thereto. In addition, although the organic light emitting devices according to the first and second embodiments and illustrated herein are bottom emission type organic light emitting devices, a top emission type organic light emitting device may also be used. That is, the organic light emitting device may be designed to emit light in a direction opposite to the substrate 100 instead of toward the substrate 100. When the organic light emitting device is a top emission type organic light emitting device, the lamination order may be reversed.

Figure 5A:
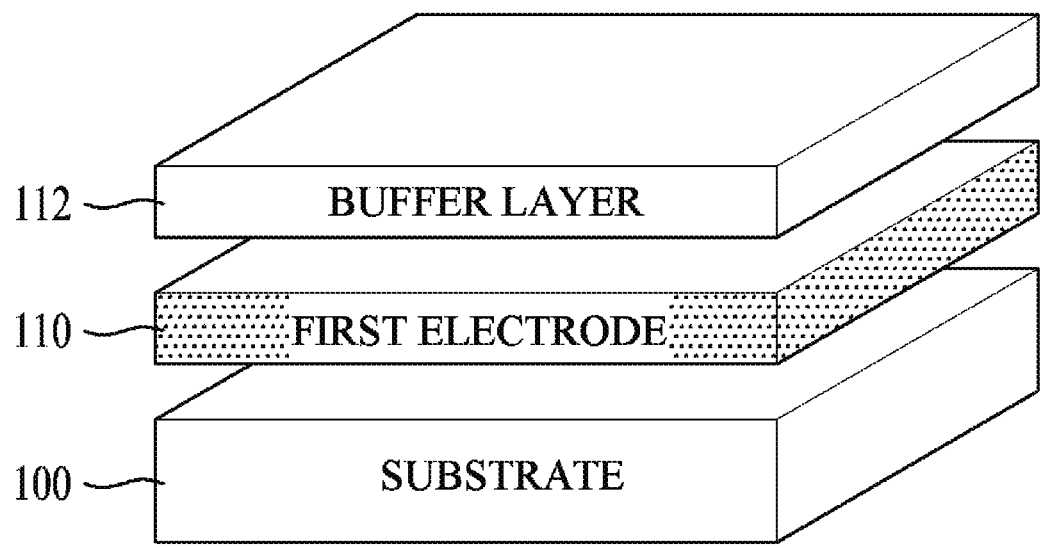
FIGS. 5A to 5C are perspective views for describing an organic light emitting device.
Figure 5B:
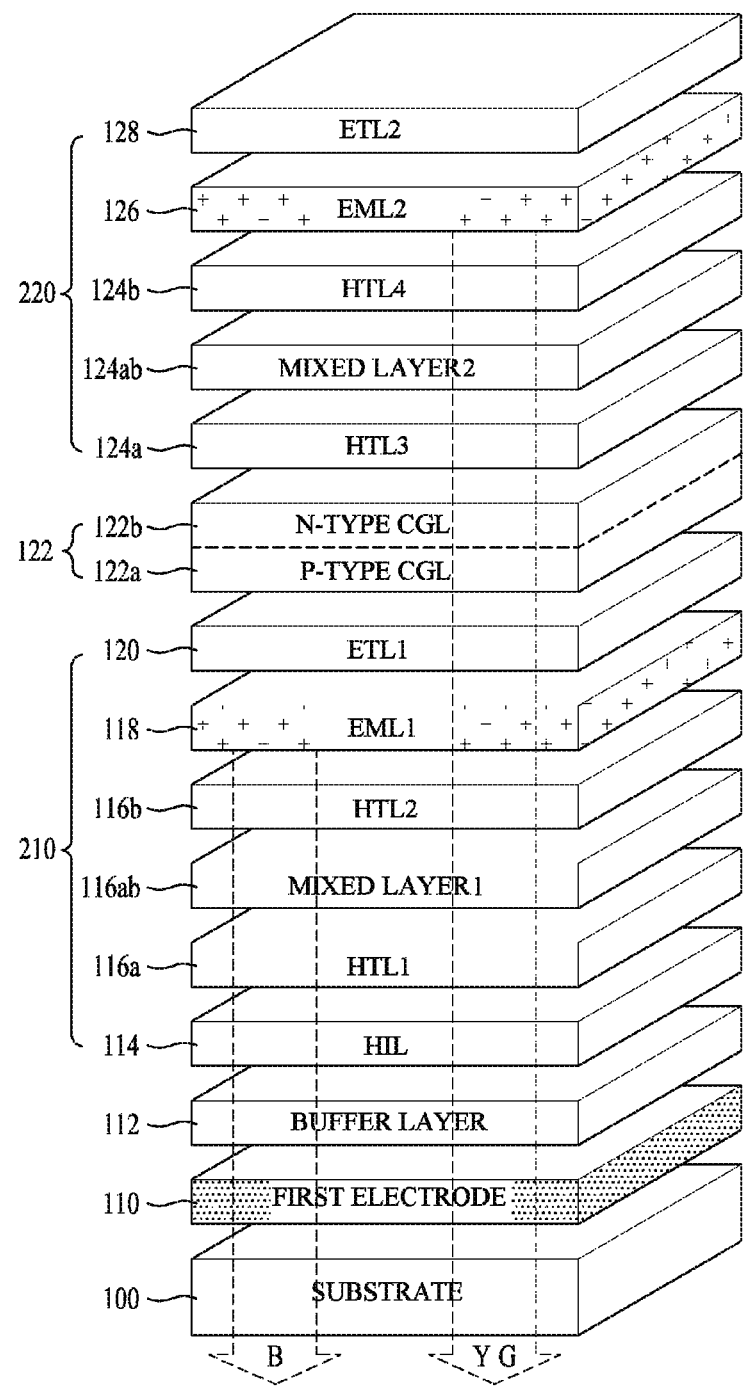
Figure 5C:
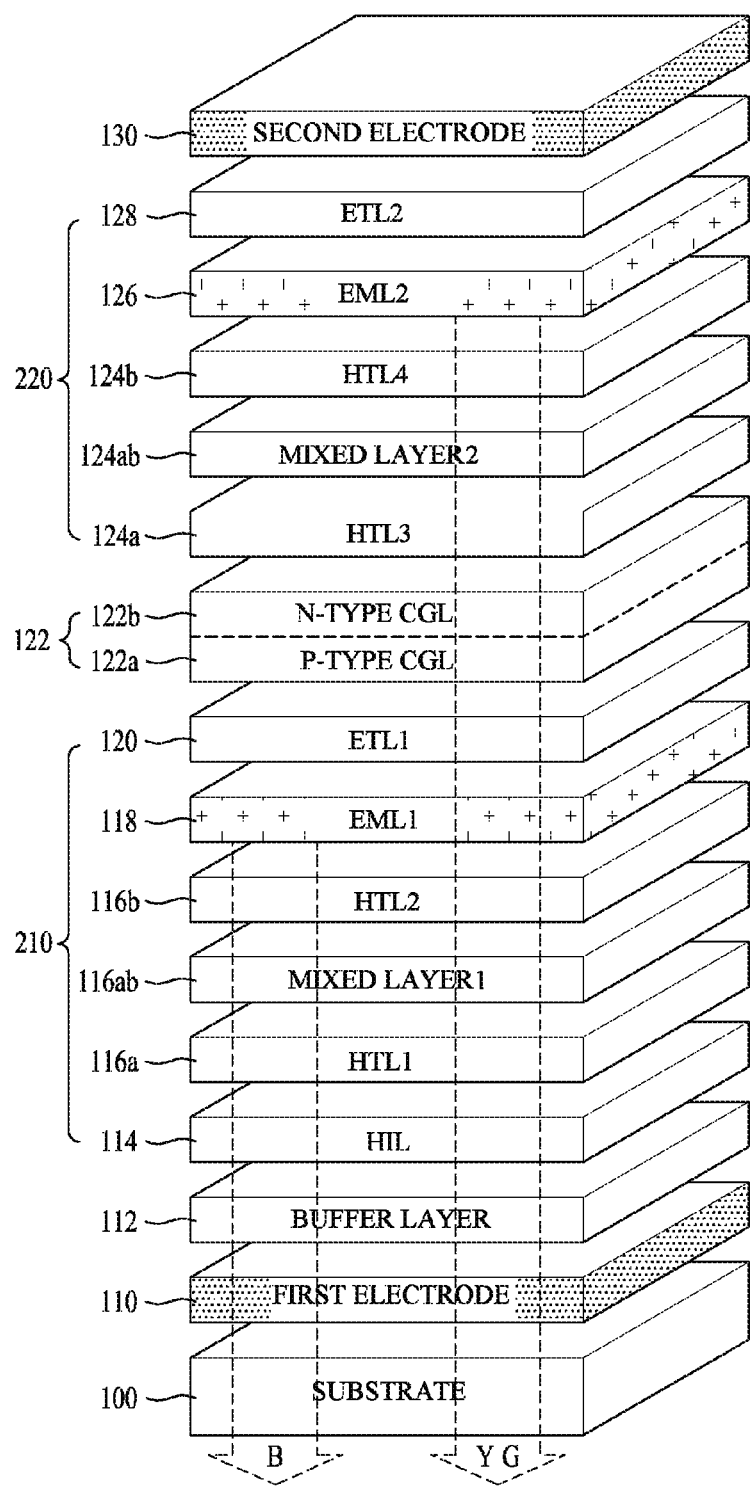
Figure 6:
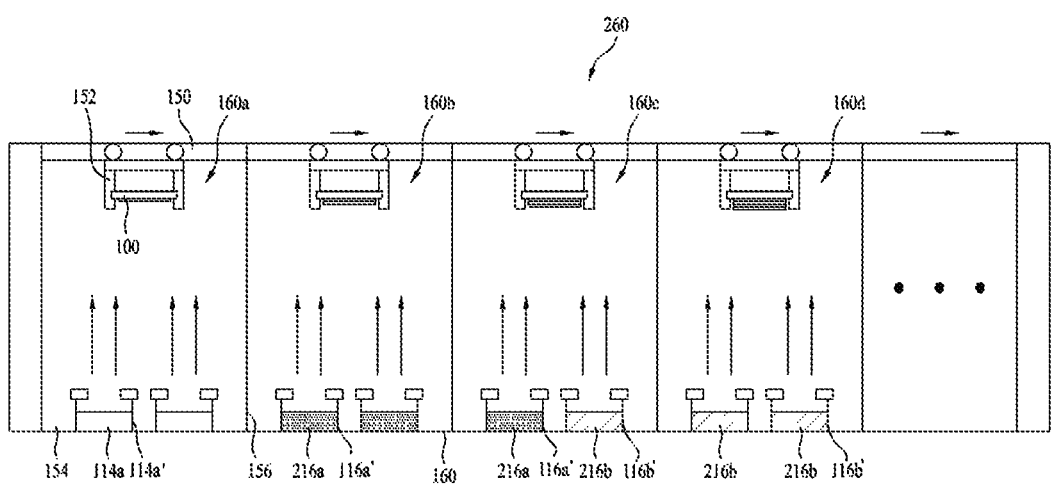
FIG. 6 is a cross-sectional view illustrating a vacuum deposition device of an organic light emitting device.

FIGS. 5A to 5C are perspective views for describing an organic light emitting device according to the present embodiments. FIG. 6 is a cross-sectional view illustrating a vacuum deposition device of an organic light emitting device according to the present embodiments. FIGS. 7A to 7D are cross-sectional views illustrating a vacuum deposition device for describing a method of manufacturing a first stack according to the present embodiments.

With reference to FIG. 5A, the first electrode 110 and the buffer layer 112 are sequentially formed on the substrate 100 using a deposition method such as sputtering. The first electrode 110 may be formed of a transparent conductive material, for example, a transparent conductive oxide (TCO) such as indium tin oxide (ITO) and indium zinc oxide (IZO).

With reference to FIG. 5B, the first stack 210, the charge generation layer 122, and the second stack 220 are sequentially formed using a vacuum deposition device 260. In other words, the hole injection layer 114, the first hole transport layer 116a, the first mixed layer 116ab, the second hole transport layer 116b, the first light emitting layer 118, and the first electron transport layer 120 are sequentially laminated on the substrate 100 provided with the first electrode 110 and buffer layer 112 to form the first stack 210. The n-type charge generation layer 122a and the p-type charge generation layer 122b are sequentially laminated on the first electron transport layer 120 of the first stack 210 to form the charge generation layer 122. The third hole transport layer 124a, the second mixed layer 124ab, the fourth hole transport layer 124b, the second light emitting layer 126, and the second electron transport layer 128 are sequentially laminated thereon to form the second stack 220.

Particularly, as illustrated in FIG. 6, the vacuum deposition device 260 includes a vacuum chamber 160 including a plurality of film forming chambers 160a to 160d for deposition of organic layers, barrier walls 156 partitioning the film forming chambers 160a to 160d, evaporation sources 114a', 116a', and 116b' respectively including organic materials for forming organic layers and disposed in the film forming chambers 160a to 160d, holders 152 fixing the substrate 100, and a rail 150 for moving the substrate 100 from one of the film forming chambers 160a to 160d to another. A method of forming organic layers of the first stack 210, the charge generation layer 122, and the second stack 220 using the vacuum deposition device 260 will be described with reference to FIGS. 7A to 7D.

Figure 7A:
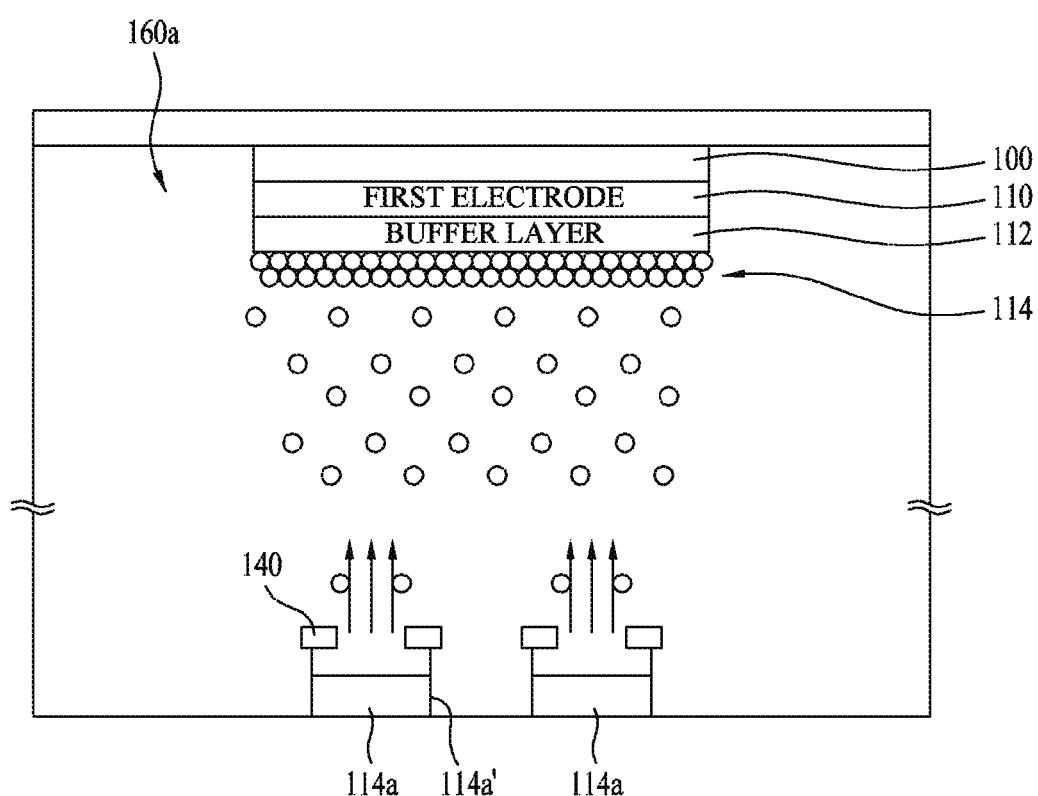
FIGS. 7A to 7D are cross-sectional views illustrating a vacuum deposition device for describing a method of manufacturing a first stack.

As illustrated in FIG. 7A, the substrate 100 provided with the first electrode 110 and the buffer layer 112 is transported into the first film forming chamber 160a via the rail 150. A first evaporation container 114a' containing an organic material 114a for forming the hole injection layer 114 and a shutter 140 for controlling deposition of the organic material 114a are disposed in the first film forming chamber 160a. When the shutter 140 is open, the first evaporation container 114a' evaporates the organic material 114a for forming the hole injection layer 114 contained in the first evaporation container 114a' by heating, and the organic material 114a for forming the hole injection layer 114 evaporated from the first evaporation container 114a' is deposited on the substrate 100 to form the hole injection layer 114.

Figure 7B:
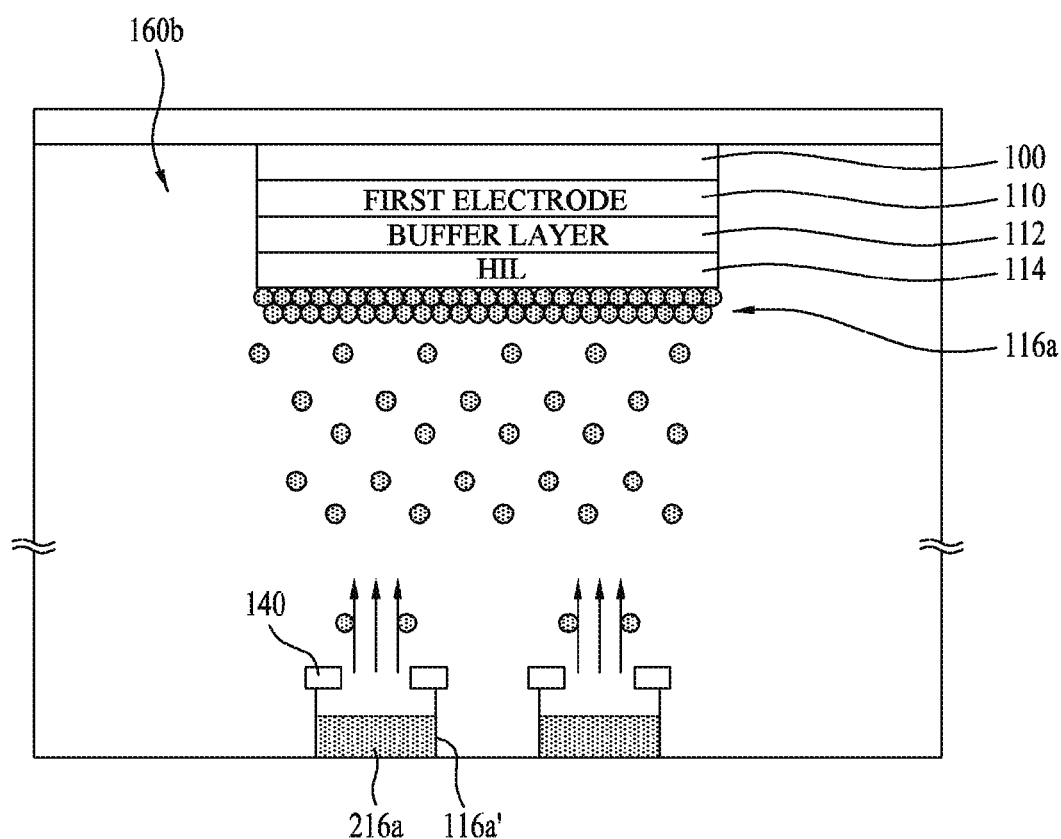

Then, as illustrated in FIG. 7B, the substrate 100 provided with the hole injection layer 114 is transported into the second film forming chamber 160b via the rail 150. A second evaporation container 116a' containing an organic material 216a for forming the first hole transport layer 116a and a shutter 140 for controlling deposition of the organic material 216a are disposed in the second film forming chamber 160b. When the shutter 140 is open, the second evaporation container 116a' evaporates the organic material 216a for forming the first hole transport layer 116a contained in the second evaporation container 116a' by heating, and the organic material 216a for forming the hole transport layer 116a evaporated from the second evaporation container 116a' is deposited on the substrate 100 to form the first hole transport layer 116a.

Here, the first hole transport layer 116a is formed of an amine derivative represented by Formula 1 below to a thickness of 400 Å to 1400 Å. Here, $R1 \ne R2 \ne R3$, and R1, R2, and R3 constitute an aromatic ring.

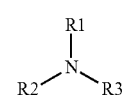

Formula 1

Figure 7C:
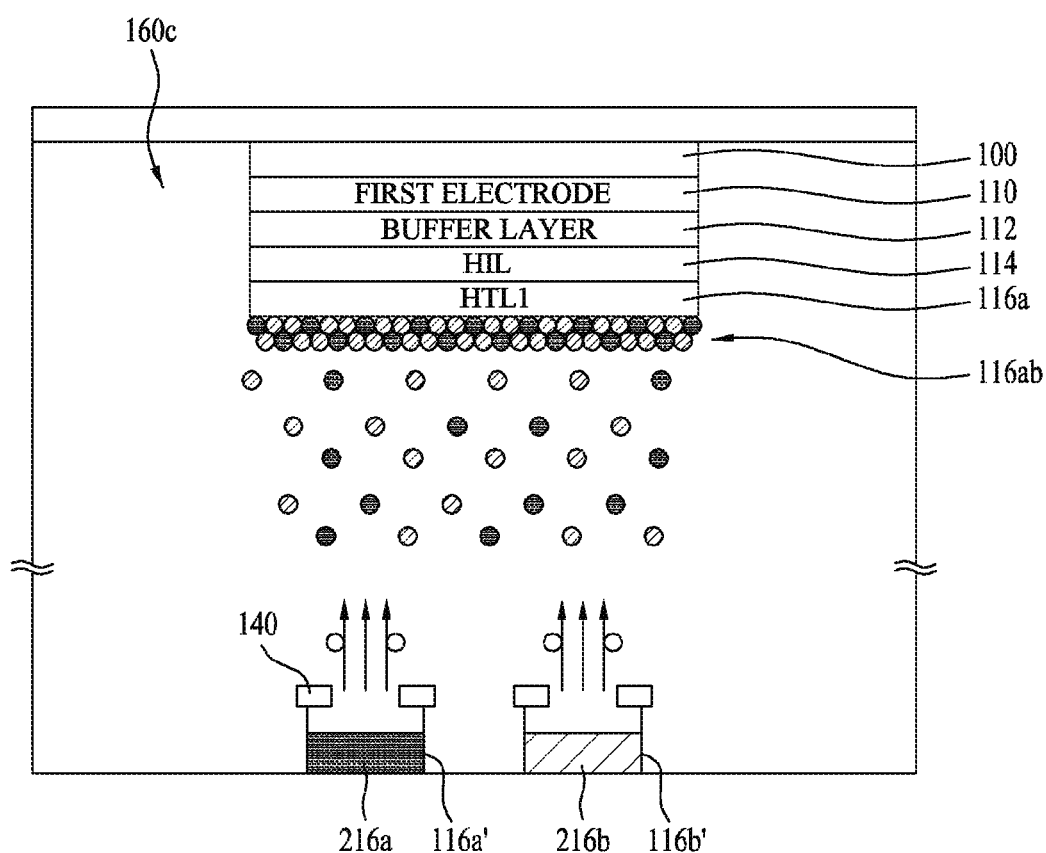

Then, as illustrated in FIG. 7C, the substrate 100 provided with the first hole transport layer 116a is transported into the third film forming chamber 160c via the rail 150. A second evaporation container 116a' containing the organic material 216a for forming the first hole transport layer 116a, a third evaporation container 116b' including an organic material 216b for forming the second hole transport layer 116b, and shutters for controlling deposition of the organic materials 216a and 216b by the second and third evaporation container 116a' and 116b' are disposed in the third film forming chamber 160c. The organic material 216a for forming the first hole transport layer 116a is the same as the organic material used in the second film forming chamber 160b, and the organic material 216b for forming the second hole transport layer 116b contained in the third evaporation container 116b' is a furan or thiophene derivative having a hole mobility of $10^{-7}$ to $10^{-5}$ cd/Vs.

When the shutter 140 of the second evaporation container 116a' and the shutter 140 of the third evaporation container 116b' are simultaneously open, the second evaporation container 116a' evaporates the organic material 216a for forming the first hole transport layer 116a contained in the second evaporation container 116a' by heating, and the third evaporation container 116b' evaporates the organic material 216b for forming the second hole transport layer 116b contained in the third evaporation container 116b' by heating. Accordingly, the organic material 216a for forming the first hole transport layer 116a evaporated from the second evaporation container 116a' and the organic material 216b for forming the second hole transport layer 116b evaporated from the third evaporation container 116b' are deposited on the substrate 100 to form a first mixed layer 116ab including the materials for forming the first hole transport layer 116a and the second hole transport layer 116b. The first mixed layer 116ab is formed by co-depositing the materials used to form the first hole transport layer 116a and the second hole transport layer 116b to a thickness of 10 Å to 1000 Å.

Figure 7D:
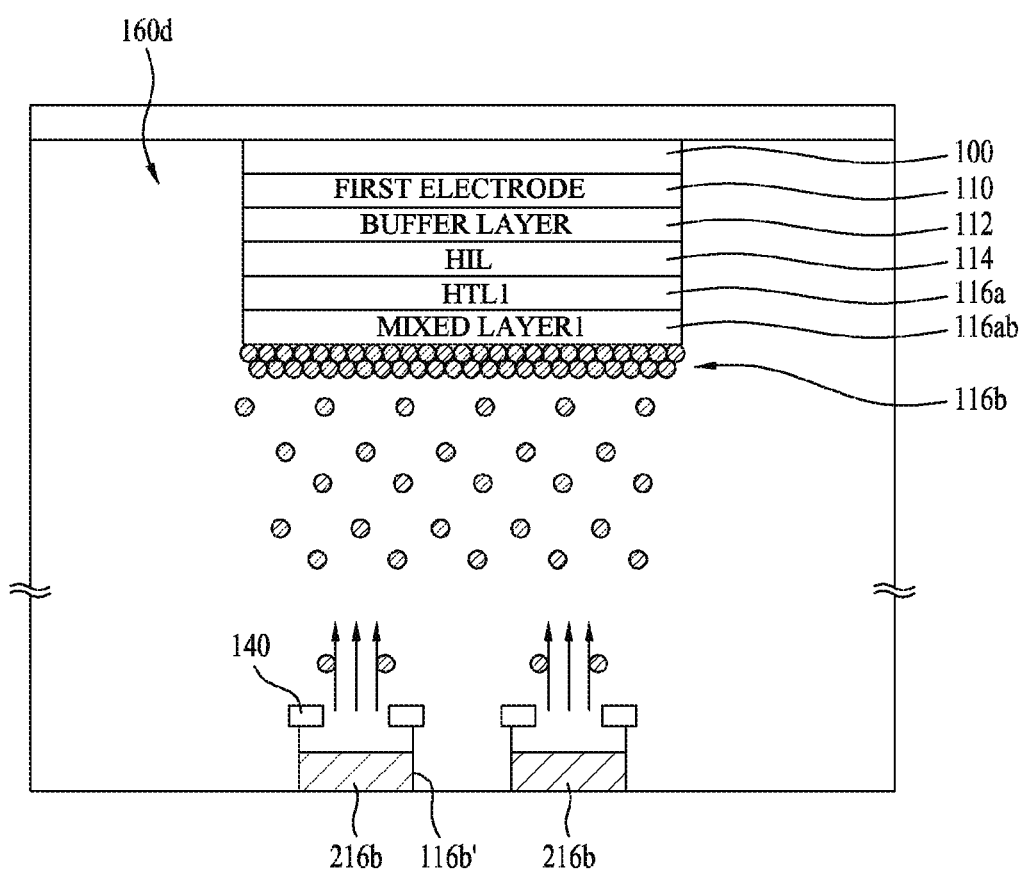

Then, as illustrated in FIG. 7D, the substrate 100 provided with the first mixed layer 116ab is transported into the fourth film forming chamber 160d via the rail 150. A third evaporation container 116b' containing the organic material 216b for forming the second hole transport layer 116b and a shutter 140 for controlling deposition of the organic material 216b are disposed in the fourth film forming chamber 160d. When the shutter 140 is open, the third evaporation source 116b' evaporates the organic material 216b for forming the second hole transport layer 116b contained in the third evaporation container 116b' by heating, and the organic material 216b for forming the second hole transport layer 116b evaporated from the third evaporation source 116b' is deposited on the substrate 100 to form the second hole transport layer 116b.

According to the method described above, the first electron transport layer 120 of the first stack 210, the charge generation layer 122 including the n-type charge generation layer 122a and the p-type charge generation layer 122b, and the third hole transport layer 124a, the second mixed layer 124ab, the fourth hole transport layer 124b, the second light emitting layer 126, and the second electron transport layer 128 of the second stack 220 are sequentially formed.

Particularly, the second mixed layer 124ab of the second stack 220 may be formed by co-depositing organic materials used to form the third hole transport layer 124a and the fourth hole transport layer 124b by use of an evaporation source including the organic material used to form the third hole transport layer 124a and an evaporation source including the organic material used to form the fourth hole transport layer 124b in the same manner as the first mixed layer 116ab as illustrated in FIG. 4C. In this regard, the third hole transport layer 124a is formed of the same material as the first hole transport layer 116a, and the fourth hole transport layer 124b is formed of the same material as the second hole transport layer 116b.

Finally, the second electrode 130 is formed on the substrate 100 provided with the first stack 210, the charge generation layer 122, and the second stack 220 using a deposition method such as sputtering. The second electrode 130 is formed of a reflective metallic material such as aluminum (Al), gold (Au), molybdenum (MO), chromium (Cr), copper (Cu), and LiF or an alloy of aluminum and LiF.

As is apparent from the above description, since the organic light emitting device according to the present embodiments includes the mixed layer of the first and second hole transport layers formed of different materials and disposed between the first and second hole transport layers, an interfacial barrier between the first and second hole transport layers is removed, thereby facilitating hole injection to improve efficiency and lifespan of the organic light emitting device.

In addition, since the first hole transport layer is formed of a material having a higher hole mobility than the second hole transport layer to increase hole mobility, and the second hole transport layer 116b has a lower hole mobility than conventional hole transport layers, i.e., $10^{-4}$ cm$^2$/Vs, holes are recombined with electrons in the light emitting layer without escaping from the light emitting layer.

In this regard, since the first and second hole transport layers have different hole mobilities and are formed of different materials, the interfacial barrier between the first and second hole transport layers may generally increase. However, according to the present embodiments, a mixed layer is formed between the first and second hole transport layers, so that the interfacial barrier therebetween is removed to increase hole mobility and increase recombination rate of holes and electrons in the light emitting layer. As a result, light emission efficiency and lifespan of the organic light emitting device are improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
   a substrate;
   a first electrode on the substrate;
   a buffer layer on the first electrode;
   organic layers on the buffer layer, the organic layers comprising a hole injection layer, a first hole transport layer, a mixed layer, a second hole transport layer, a light emitting layer, and an electron transport layer sequentially laminated on the first electrode; and
   a second electrode on the organic layers,
   wherein the buffer layer is between the first electrode and the hole injection layer,
   wherein the mixed layer consists of materials used to form the first and second hole transport layers mixed together, and removes an interfacial barrier between the first hole transport layer and the second hole transport layer so that holes are recombined with electrons in the light emitting layer for transition to an excited state instead of moving to the electron transport layer,
   wherein the materials used to form the first and second hole transport layers have a uniform distribution in the mixed layer,
   wherein the mixed layer has a thickness within the range of 250 Å to 450 Å, and wherein the first hole transport layer is formed of a material having a higher hole mobility than the second hole transport layer, wherein the second hole transport layer includes a furan derivative having a hole mobility of $10^{-7}$ to $10^{-5}$ cm$^2$/Vs, and wherein the first hole transport layer transports holes received from the hole injection layer to the second hole transport layer and has a thickness of 400 Å to 1400 Å, and the second hole transport layer transports holes received from the first hole transport layer to the light emitting layer and has a triplet energy higher than that of the light emitting layer to prevent holes transported to the light emitting layer from reentering the second hole transport layer and has a thickness of 100 Å to 150 Å.

2. The organic light emitting device according to claim 1, wherein the first hole transport layer includes an amine derivative represented by Formula 1 below, wherein R1≠R2≠R3, and R1, R2, and R3 each constitute an aromatic ring:

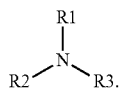

Formula 1

3. An organic light emitting device comprising:
a substrate;
a first electrode on the substrate;
a buffer layer on the first electrode;
a second electrode;
a first stack on the buffer layer and comprising a hole injection layer, a first hole transport layer, a first mixed layer, a second hole transport layer, a first light emitting layer, and a first electron transport layer sequentially laminated;
a second stack between the first stack and the second electrode and comprising a third hole transport layer, a fourth hole transport layer, a second light emitting layer, and a second electron transport layer sequentially laminated; and
a charge generation layer between the first stack and the second stack to control charge balance between the first and second stacks,
wherein the buffer layer is between the first electrode and the hole injection layer,
wherein the first light emitting layer includes a host doped with a blue fluorescent dopant,
wherein the second light emitting layer includes two hosts doped with a yellow-green phosphorescence dopant,
wherein the first mixed layer consists of materials used to form the first and second hole transport layers, and removes an interfacial barrier between the first hole transport layer and the second hole transport layer so that holes are recombined with electrons in the light emitting layer for transition to an excited state instead of moving to the electron transport layer,
wherein the materials used to form the first and second hole transport layers have a uniform distribution in the first mixed layer,
wherein the first mixed layer has a thickness within the range of 250 Å to 450 Å, and wherein the first hole transport layer is formed of a material having a higher hole mobility than the second hole transport layer, wherein the second hole transport layer includes a furan derivative having a hole mobility of $10^{-7}$ to $10^{-5}$ cm$^2$/Vs, and wherein the first hole transport layer transports holes received from the hole injection layer to the second hole transport layer and has a thickness of 400 Å to 1400 Å, and the second hole transport layer transports holes received from the first hole transport layer to the first light emitting layer and has a triplet energy higher than that of the first light emitting layer to prevent holes transported to the first light emitting layer from reentering the second hole transport layer and has a thickness of 100 Å to 150 Å.

4. The organic light emitting device according to claim 3, further comprising a second mixed layer formed of materials used to form the third and fourth hole transport layers and disposed between the third and fourth hole transport layers.

5. The organic light emitting device according to claim 3, wherein the first hole transport layer includes an amine derivative represented by Formula 1 below, wherein R1≠R2≠R3, and R1, R2, and R3 each constitute an aromatic ring:

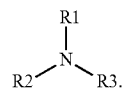

Formula 1

6. A method of fabricating an organic light emitting device, the method comprising:
forming a first electrode on a substrate;
forming a buffer layer on the first electrode;
forming a first stack by sequentially laminating a hole injection layer, a first hole transport layer, a first mixed layer, a second hole transport layer, a first light emitting layer, and a first electron transport layer on the buffer layer;
forming a charge generation layer by sequentially laminating an n-type charge generation layer and a p-type charge generation layer on the first electron transport layer of the first stack; and
forming a second stack by sequentially laminating a third hole transport layer, a fourth hole transport layer, a second light emitting layer, and a second electron transport layer on the p-type charge generation layer,
wherein the first mixed layer consists of materials used to form the first and second hole transport layers, and removes an interfacial barrier between the first hole transport layer and the second hole transport layer so that holes are recombined with electrons in the light emitting layer for transition to an excited state instead of moving to the electron transport layer,
wherein the materials used to form the first and second hole transport layers have a uniform distribution in the first mixed layer,
wherein the first mixed layer has a thickness within the range of 250 Å to 450 Å,
wherein the first hole transport layer is formed of a material having a higher hole mobility than the second hole transport layer, wherein the second hole transport layer includes a furan derivative having a hole mobility of $10^{-7}$ to $10^{-5}$ cm$^2$/Vs, and wherein the first hole transport layer transports holes received from the hole injection layer to the second hole transport layer and has a thickness of 400 Å to 1400 Å, and the second hole transport layer transports holes received from the first hole transport layer to the first light emitting layer and has a triplet energy higher than that of the first light emitting layer to prevent holes transported to the first light emitting layer from reentering the second hole transport layer and has a thickness of 100 Å to 150 Å.

7. The method of claim 6, wherein the forming of the second stack further comprises forming a second mixed layer by co-depositing materials used to form the third and fourth hole transport layers between the third and fourth hole transport layers to mix the materials of the third and fourth hole transport layer.

8. The method of claim 6, wherein the first hole transport layer includes an amine derivative represented by Formula 1 below, wherein R1≠R2≠R3, and R1, R2, and R3 each constitute an aromatic ring:

Formula 1

9. The method of claim 6, further comprising forming a second electrode on the second stack.

* * * * *